(12) United States Patent
Aoki

(10) Patent No.: US 9,024,405 B2
(45) Date of Patent: May 5, 2015

(54) SOLID-STATE IMAGE SENSOR

(75) Inventor: Takeshi Aoki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 147 days.

(21) Appl. No.: 13/034,194

(22) Filed: Feb. 24, 2011

(65) Prior Publication Data

US 2011/0227182 A1    Sep. 22, 2011

(30) Foreign Application Priority Data

Mar. 17, 2010   (JP) ................................. 2010-061233
Feb. 16, 2011   (JP) ................................. 2011-031260

(51) Int. Cl.
  *H01L 27/14*   (2006.01)
  *H01L 27/146*  (2006.01)

(52) U.S. Cl.
  CPC .... *H01L 27/14636* (2013.01); *H01L 27/14623* (2013.01); *H01L 27/14683* (2013.01)

(58) Field of Classification Search
  USPC .......... 257/435, 432, 431, E31.121, E31.122, 257/443
  See application file for complete search history.

(56) References Cited

U.S. PATENT DOCUMENTS

| 7,019,373 | B2* | 3/2006  | Hashimoto ................... 257/432 |
| 7,205,623 | B2  | 4/2007  | Hong et al. ..................... 438/48 |
| 7,545,423 | B2  | 6/2009  | Park et al. ..................... 348/294 |
| 7,598,581 | B2* | 10/2009 | Lee et al. ...................... 257/435 |
| 7,749,788 | B2  | 7/2010  | Okagawa et al. .............. 438/48 |
| 8,098,312 | B2  | 1/2012  | Matsuo et al. |
| 8,508,010 | B2  | 8/2013  | Maruyama |
| 2011/0186951 | A1* | 8/2011 | Pyo .............................. 257/432 |

FOREIGN PATENT DOCUMENTS

| CN | 1722459 A    | 1/2006  |
| CN | 101127323 A  | 2/2008  |
| JP | 2-143560 A   | 6/1990  |
| JP | 2001-196571 A | 7/2001 |
| JP | 2006-093687 A | 4/2006 |
| JP | 2007-134664 A | 5/2007 |
| JP | 2008-67060 A  | 3/2008 |
| JP | 2009-094299 A | 4/2009 |
| JP | 2009-164247 A | 7/2009 |
| JP | 2009-283482 A | 12/2009 |
| JP | 2009-290000 A | 12/2009 |

* cited by examiner

*Primary Examiner* — Michael Shingleton
(74) *Attorney, Agent, or Firm* — Fitzpatrick, Cella, Harper & Scinto

(57) ABSTRACT

A solid-state image sensor including an effective pixel portion in which a plurality of pixels including photodiodes formed on a semiconductor substrate are arranged, and a peripheral portion arranged around the effective pixel portion, includes a plurality of metal wiring layers arranged above the semiconductor substrate, and a planarizing film covering a patterned metal wiring layer that is a top layer among the plurality of metal wiring layers, wherein in the effective pixel portion, the plurality of metal wiring layers have openings configured to guide light to the photodiodes, and in the peripheral portion, an opening is provided in the top layer, and at least one metal wiring layer between the top layer and the semiconductor substrate has a pattern which blocks light incident on the photodiodes via the opening in the top layer.

14 Claims, 9 Drawing Sheets

SOLID-STATE IMAGE SENSOR

BACKGROUND OF THE INVENTION

1. Field of the Invention

The present invention relates to a solid-state image sensor.

2. Description of the Related Art

FIG. 1A is a plan view showing the plan layout of a solid-state image sensor. The solid-state image sensor shown in FIG. 1A includes an effective pixel region 1, optical black region 2, and peripheral circuit region 3. Each of the effective pixel region 1 and optical black region 2 includes a two-dimensional array of a plurality of pixels. An operational amplifier circuit, horizontal scanning circuit, and vertical scanning circuit, for example, are arranged in the peripheral circuit region 3. A light-shielding film made of a metal film opens in each pixel in the effective pixel region 1, while it covers almost the entire surfaces of the optical black region 2 and peripheral circuit region 3. A pixel signal from the optical black region 2 is used as a black-level reference signal. A planarizing film made of an insulating film such as a silicon oxide film is arranged on the light-shielding film for planarization. In this case, the planarizing film must have a given uniformity in order to suppress a color variation due to nonuniformity of the optical path difference between the pixels within the effective pixel region 1.

This planarizing film is formed by polishing and planarizing the surface of an insulating film such as a silicon oxide film deposited on a light-shielding film having steps using a CMP (Chemical Mechanical Polishing) method. The polishing rate of a silicon oxide film by CMP is slower on a light-shielding film with a high area occupancy than on a light-shielding film with a low area occupancy. Therefore, steps are generated on the surface of the planarizing film at the boundary between the effective pixel region in which the light-shielding film has a low area occupancy and the effective pixel region peripheral portion in which the light-shielding film has a high area occupancy. Due to factors associated with these steps, the thickness of the planarizing film varies between the central portion and outer peripheral portion of the effective pixel region, thus generating a color variation resulting from an optical path difference. Japanese patent Laid-Open No. 2001-196571 discloses a method for solving the above-mentioned problem. According to Japanese Patent Laid-Open No. 2001-196571, the steps on the planarizing film at the boundary between the effective pixel region and the effective pixel region peripheral portion can be reduced by arranging, in a groove formed in advance, the light-shielding film in the effective pixel region peripheral portion, which has a high area occupancy.

Unfortunately, the method described in Japanese Patent Laid-Open No. 2001-196571 is disadvantageous in that it requires a new process of forming a groove. Also, this method is insufficient to fundamentally eliminate the nonuniformity of the planarizing film due to the difference in area occupancy of the light-shielding film.

SUMMARY OF THE INVENTION

The present invention provides a solid-state image sensor which can reduce nonuniformity of a planarizing film by reducing a difference in area occupancy of a light-shielding film without adding a new process.

One of aspects of the present invention provides a solid-state image sensor including an effective pixel portion in which a plurality of pixels including photodiodes formed on a semiconductor substrate are arranged, and a peripheral portion arranged around the effective pixel portion, the sensor comprising: a plurality of metal wiring layers arranged above the semiconductor substrate; and a planarizing film covering a patterned metal wiring layer that is a top layer among the plurality of metal wiring layers, wherein in the effective pixel portion, the plurality of metal wiring layers have openings configured to guide light to the photodiodes, and in the peripheral portion, an opening is provided in the top layer, and at least one metal wiring layer between the top layer and the semiconductor substrate has a pattern which blocks light incident on the photodiodes via the opening in the top layer.

Further features of the present invention will become apparent from the following description of exemplary embodiments with reference to the attached drawings.

DESCRIPTION OF THE EMBODIMENTS

Embodiments of a solid-state image sensor and a method of manufacturing the same according to the present invention will be described in detail below with reference to the accompanying drawings.

[First Embodiment]
<Example of Configuration of Solid-State Image Sensor According to First Embodiment>

Figure 1A:
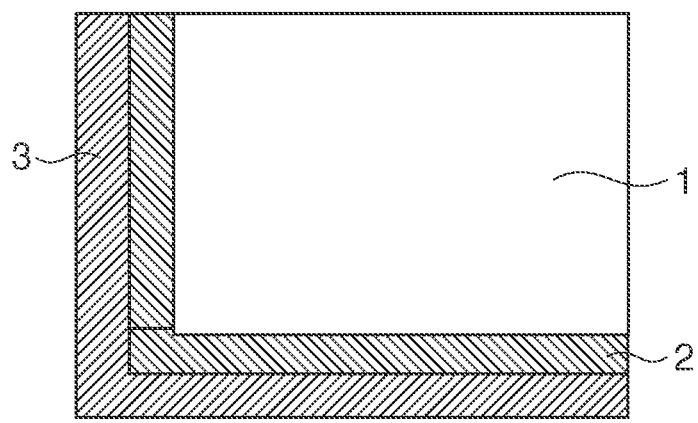
FIG. 1A is a plan view schematically showing the plan layout of a solid-state image sensor.
Figure 1B:
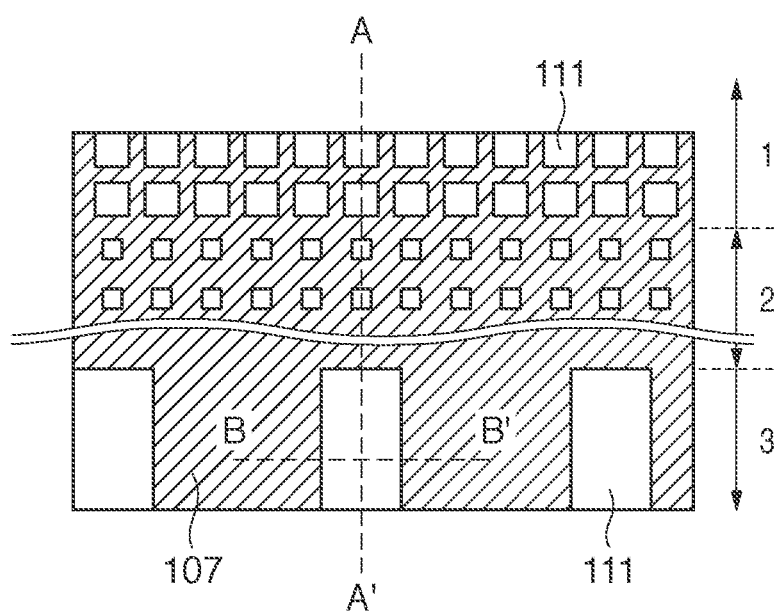
FIG. 1B is a plan view showing the plan layout of a solid-image sensor according to an embodiment of the present invention.
Figure 2A:
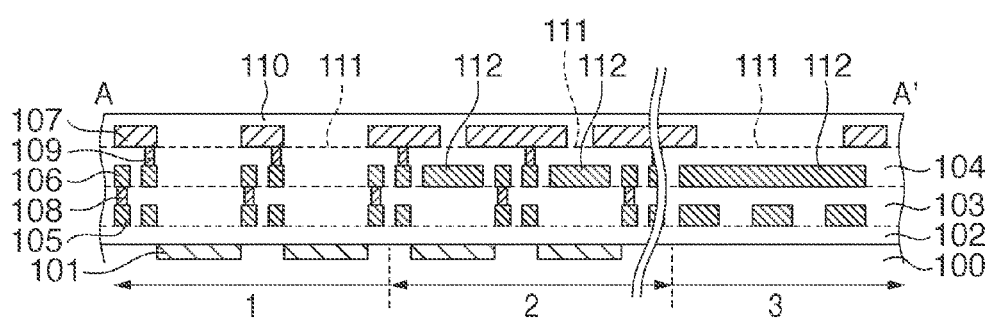
FIG. 2A is a sectional view showing an example of a cross-sectional structure taken along a broken line A-A' in FIG. 1B according to the first embodiment.
Figure 2B:
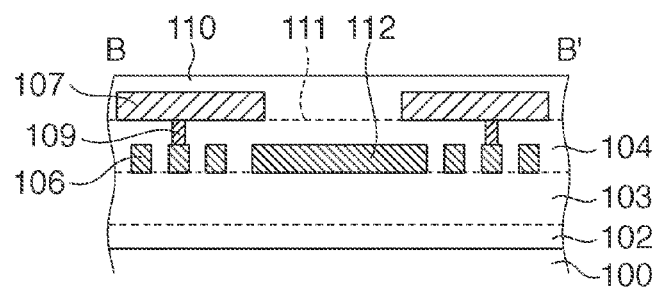
FIG. 2B is a sectional view showing an example of a cross-sectional structure taken along a broken line B-B' in FIG. 1B according to the first embodiment.

FIG. 1B is an enlarged plan view showing an example of the plan layout of the solid-state image sensor shown in FIG. 1A, according to an embodiment of the present invention. FIG. 2A is a sectional view showing a cross-sectional structure taken along a broken line A-A' in FIG. 1B according to the first embodiment, and FIG. 2B is a sectional view showing a cross-sectional structure taken along a broken line B-B' in FIG. 1B. As shown in FIG. 1B, the solid-state image sensor has an effective pixel portion including an effective pixel region 1 in which a plurality of pixels are arrayed. The solid-state image sensor also has a peripheral region arranged around the effective pixel portion. A peripheral portion including an optical black region 2 used to obtain a reference signal and a peripheral circuit region 3 is arranged in the peripheral region. Each of the effective pixel region 1 and optical black region 2 includes a two-dimensional array of a plurality of pixels. The peripheral circuit region 3 is used to control the operation of the effective pixel region 1 and to process a signal read from the effective pixel region 1, and includes, for example, an operational amplifier circuit, horizontal scanning circuit, and vertical scanning circuit. As shown in FIG. 2A, photodiodes 101 are provided on a semiconductor substrate 100 in the effective pixel region 1 and optical black region 2. For the sake of simplicity, some of MOS transistors and metal plugs provided on the semiconductor substrate 100 are not shown. A first metal wiring layer 105, second metal wiring layer 106, and light-shielding film 107 are formed on insulating films 102, 103, and 104, respectively, above the semiconductor substrate 100. The light-shielding film 107 also serves as a metal wiring layer used as a reference potential and a power supply line. The light-shielding film 107 is the top layer among the metal wiring layers 105, 106, and 107. The first metal wiring layer 105 and second metal wiring layer 106 can be electrically connected to each other by metal plugs 108. The second metal wiring layer 106 and light-shielding film 107 can be electrically connected to each other by metal plugs 109. The insulating films 102, 103, and 104 are formed from, for example, silicon oxide films. The first metal wiring layer 105, second metal wiring layer 106, and light-shielding film 107 are formed from, for example, a metal or intermetallic compound containing aluminum as its major component. The metal plugs 108 and 109 are formed from, for example, a metal containing tungsten as its major component. The light-shielding film 107 is covered with a planarizing film 110, which is formed from an insulating film such as a silicon oxide film.

Conventionally, almost the entire surfaces of the optical black region 2 and peripheral circuit region 3 are covered with the light-shielding film 107. In contrast, in the first embodiment, openings 111 are provided in the light-shielding film 107 which covers the optical black region 2 and peripheral circuit region 3, as shown in FIG. 1B. The openings 111 are provided in the light-shielding film 107 on all pixels in the optical black region 2, as shown in FIG. 2A. A dummy metal film 112 is provided in the same layer as the second metal wiring layer 106 below the light-shielding film 107, and plays a role in blocking light incident on the photodiodes 101 via the openings 111. Moreover, the openings 111 are provided above regions in which the dummy metal film 112 can be provided in the same layer as the second metal wiring layer 106 below the light-shielding film 107 in the peripheral circuit region 3, as shown in FIG. 2A. The dummy metal film 112 plays a role in blocking light incident on the photodiodes 101 via the openings 111. A circuit arranged in the peripheral circuit region 3 can include, for example, a scanning circuit. Let A be the area occupancy of the light-shielding film 107 in the optical black region 2 and peripheral circuit region 3, and B be the area occupancy of the light-shielding film 107 in the effective pixel region 1. To improve the uniformity of the planarizing film 110, the ratio (=B/A) of the area occupancy B to the area occupancy A is preferably 0.6 or more and is more preferably 0.8 or more. Ideally, B/A=1 is more desirable.

Although the openings 111 are provided in both the optical black region 2 and peripheral circuit region 3, which fall within the peripheral portion, they may be provided in one of these regions alone. The evenness improves when, for example, openings are provided in at least the optical black region 2 adjacent to the effective pixel region 1. Also, the light-shielding performance can improve while improving the evenness when openings are provided in the peripheral circuit region 3 having the optical black region 2 interposed between it and the effective pixel region 1. The peripheral portion may have no optical black region 2. In this case, the openings 111 are provided in the peripheral circuit region.

<Example of Processes of Manufacturing Solid-State Image Sensor According to First Embodiment>

A manufacturing method according to the first embodiment will be described next with reference to FIGS. 3A to 3E. For the sake of simplicity, known processes before that of forming a second metal wiring layer 106 will not be described, and the process of forming a second metal wiring layer 106 and its subsequent processes will be described.

Figure 3A:
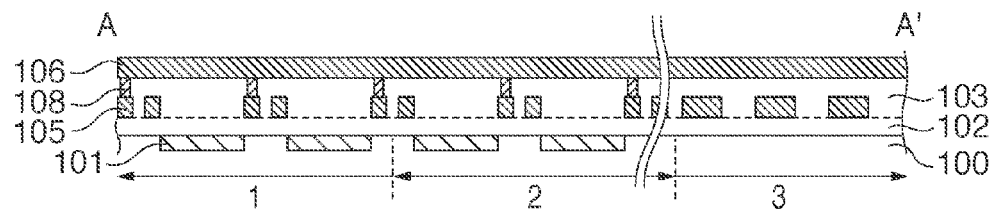
FIGS. 3A to 3E are sectional views showing an example of the processes of manufacturing a solid-state image sensor according to the first embodiment.
Figure 3B:
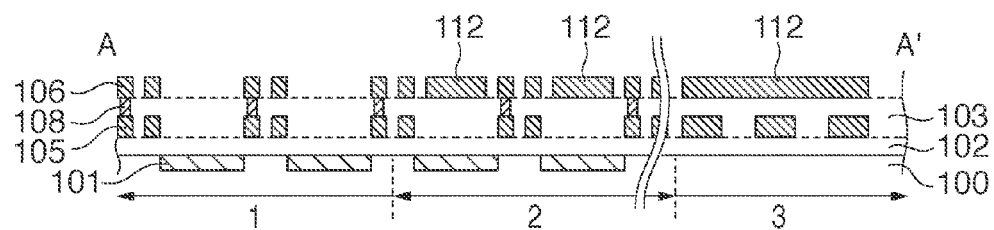
Figure 3C:
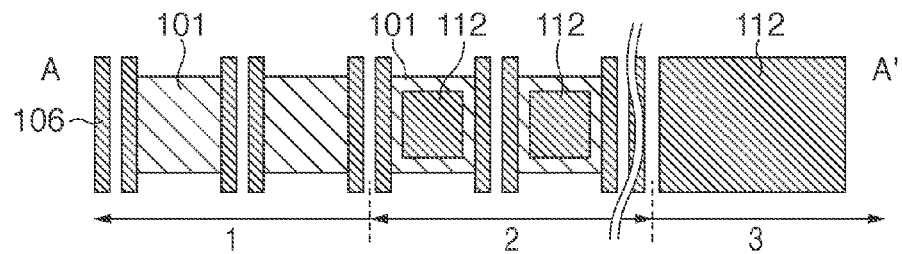
Figure 3D:
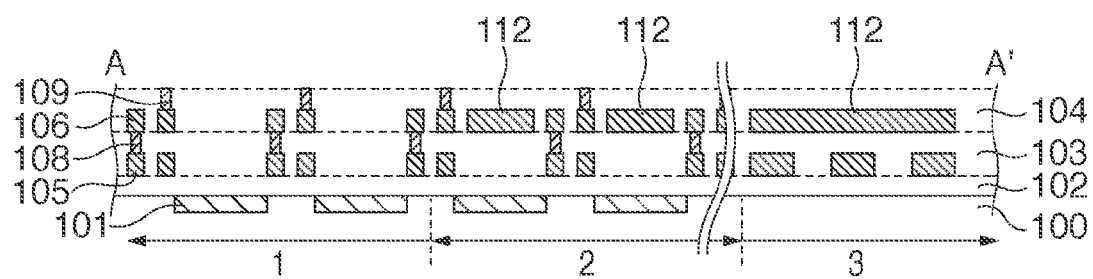
Figure 3E:
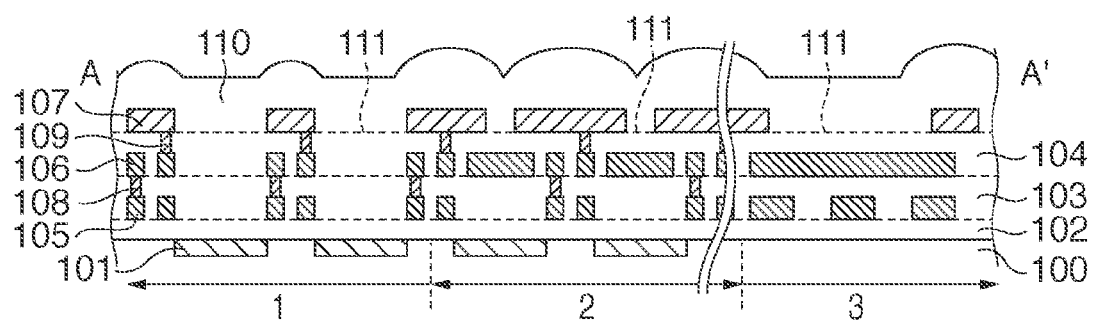

FIG. 3A is a sectional view after a metal film used to form a second metal wiring layer 106 is deposited using a sputtering method. The metal film used to form a second metal wiring layer 106 can be formed from, for example, a metal or intermetallic compound containing aluminum as its major component. Upon photoresist coating, exposure, and development, the metal film is patterned using a dry etching method to form a second metal wiring layer 106, as shown in FIG. 3B. Simultaneously with the formation of the second metal wiring layer 106, a dummy metal film 112 serving as a pattern for light blocking is formed in an optical black region 2 and peripheral circuit region 3. FIG. 3C is a view when FIG. 3B is viewed from above. Referring to FIG. 3D, an insulating film 104 such as a silicon oxide film is deposited using a plasma CVD method, and planarized using a CMP method. Upon photoresist coating, exposure, and development, openings are formed in the insulating film 104 using a dry etching method to form metal plugs 109. The metal plugs 109 can be formed by, for example, sequentially depositing titanium and titanium nitride using a sputtering method, depositing tungsten using a CVD method, and removing the titanium, titanium nitride, and tungsten in a region other than the openings using CMP. Referring to FIG. 3E, a metal film used to form a light-shielding film 107 is deposited using a sputtering method. The light-shielding film 107 can be formed from, for example, a metal or intermetallic compound containing aluminum as its major component. Upon photoresist coating, exposure, and development, openings 111 are formed in an effective pixel region 1 in the process of forming a light-shielding film by pattern formation (patterning) of the metal film using a dry etching method. At the same time, openings 111 are formed in the optical black region 2 and peripheral circuit region 3. An insulating film such as a silicon oxide film is deposited using a plasma CVD method. The insulating film is planarized using a CMP method to form a planarizing film 110, and the process reaches the state shown in FIG. 2A. The planarizing film 110 may be a silicon nitride film. An innerlayer lens, a color filter, or a microlens, for example, can also be formed after the formation of the planarizing film 110.

[Second Embodiment]
<Example of Configuration of Solid-State Image Sensor According to Second Embodiment>

Figure 4A:
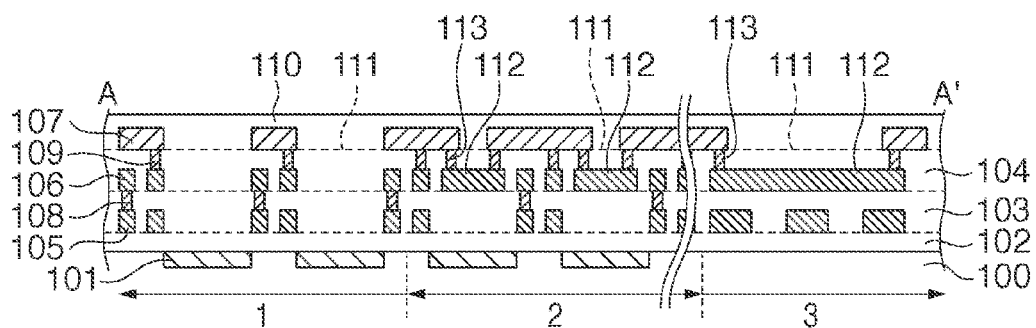
FIG. 4A is a sectional view showing an example of a cross-sectional structure taken along the broken line A-A' in FIG. 1B according to the second embodiment.

FIG. 4A is a sectional view that shows a cross-sectional structure taken along the broken line A-A' in FIG. 1B according to the second embodiment. The basic configuration in the second embodiment is the same as in the first embodiment, and a comprehensive description thereof will not be given. A feature of the second embodiment lies in that wall-shaped metal portions 113 are formed on a dummy metal film 112 in an optical black region 2 so as to surround openings 111, as shown in FIG. 4A. The dummy metal film 112 and wall-shaped metal portions 113 play a role in blocking light incident on photodiodes 101 via the openings 111. Moreover, wall-shaped metal portions 113 are formed on the dummy metal film 112 in a peripheral circuit region 3 only within planes parallel to the boundary surface between an effective pixel region 1 and an effective pixel region peripheral portion. The wall-shaped metal portions 113 prevent leakage of light incident on the photodiodes 101 in the effective pixel region 1 in a direction in which it intersects with a normal to a semiconductor substrate 100.

In the peripheral circuit region 3 according to the second embodiment, the wall-shaped metal portion 113 may be provided within a plane other than that parallel to the boundary surface between the effective pixel region 1 and the effective pixel region peripheral portion. However, an increase in capacity between wiring lines can be suppressed by adopting the arrangement of the wall-shaped metal portions 113 according to the second embodiment.

<Example of Processes of Manufacturing Solid-State Image Sensor According to Second Embodiment>

Figure 4B:
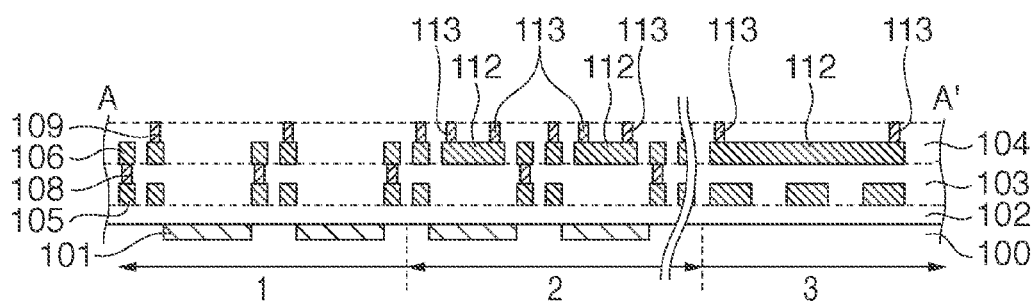
FIGS. 4B and 4C are sectional views showing an example of the processes of manufacturing a solid-state image sensor according to the second embodiment.
Figure 4C:
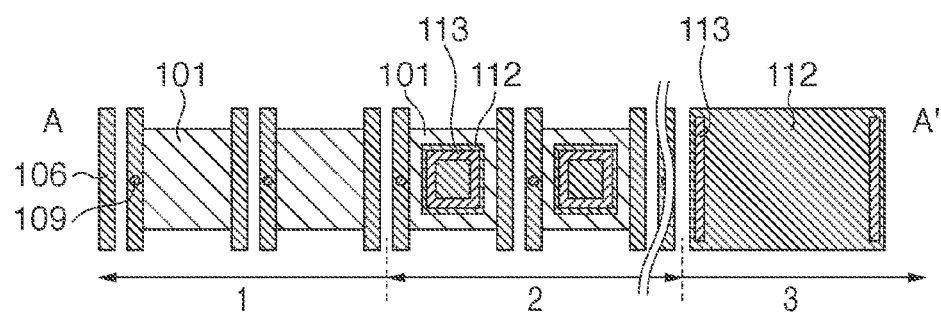

A manufacturing method according to the second embodiment will be described next. The processes until a second metal wiring layer 106 and dummy metal film 112 are formed in an optical black region 2 and peripheral circuit region 3 are the same as in the first embodiment, and their subsequent processes will be described with reference to FIGS. 4A and 4B. As shown in FIG. 4B, an insulating film 104 such as a silicon oxide film is deposited using a plasma CVD method, and planarized using a CMP method. Upon photoresist coating, exposure, and development, openings are formed in the insulating film 104 using a dry etching method to form metal plugs 109. At this time, wall-shaped metal portions 113 are simultaneously formed on the dummy metal film 112. FIG. 4C illustrates the plan layout of the wall-shaped metal portions 113. The next to the last processes are the same as in the first embodiment, and a description thereof will not be given.

[Third Embodiment]
<Example of Configuration of Solid-State Image Sensor According to Third Embodiment>

Figure 5A:
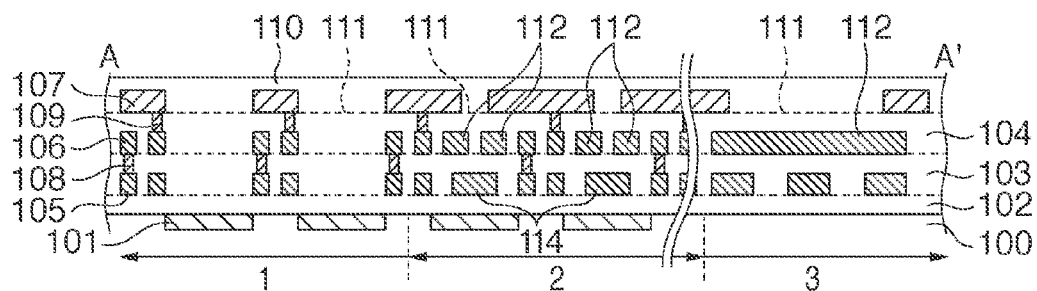
FIG. 5A is a sectional view showing an example of a cross-sectional structure taken along the broken line A-A' in FIG. 1B according to the third embodiment.
Figure 5B:
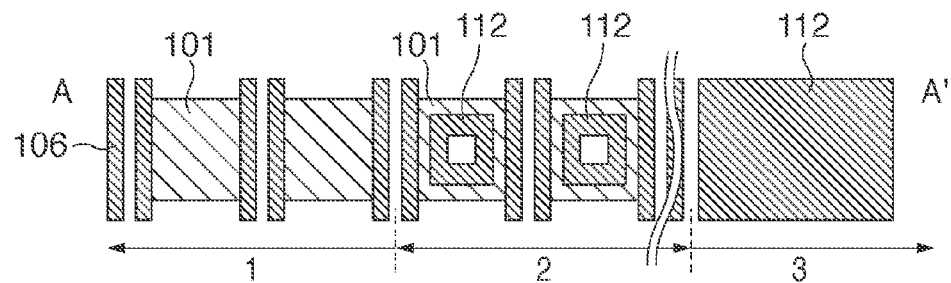
FIG. 5B is a plan view showing an example of the plan layout of a second metal wiring layer shown in FIG. 5A according to the third embodiment.
Figure 5C:
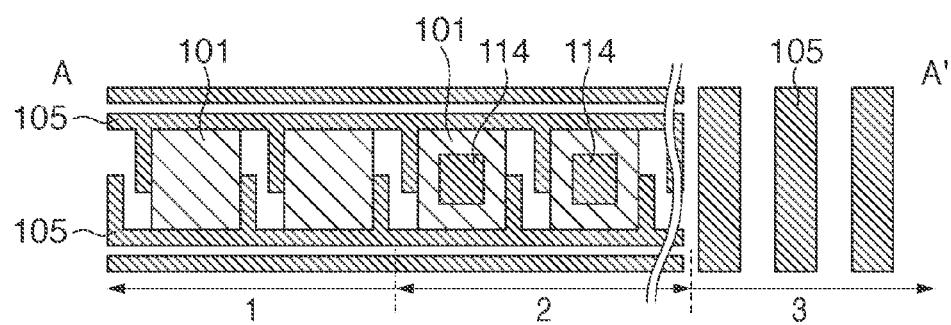
FIG. 5C is a plan view showing an example of the plan layout of a first metal wiring layer shown in FIG. 5A according to the third embodiment.

FIG. 5A is a sectional view showing a cross-sectional structure taken along the broken line A-A' in FIG. 1B according to the third embodiment. The basic configuration in the third embodiment is the same as in the first embodiment, and a comprehensive description thereof will not be given. A feature of the third embodiment lies in that dummy metal films 114 and 112 are formed in a first metal wiring layer 105 and second metal wiring layer 106, respectively, in an optical black region 2, as shown in FIG. 5A. FIG. 5B is a plan view showing the plan layout of the second metal wiring layer shown in FIG. 5A according to the third embodiment. FIG. 5C is a plan view showing the plan layout of the first metal wiring layer shown in FIG. 5A according to the third embodiment. To reduce the area occupancy of the second metal wiring layer 106 including the dummy metal film 112, the dummy metal film 112 has an opening at the center, as shown in FIG. 5B. Moreover, to prevent light incident from openings 111 from reaching the lower portion of the first metal wiring layer 105 via the dummy metal film 112 of the second metal wiring layer 106, a dummy metal film 114 is provided in the same layer as the first metal wiring layer 105, as shown in FIG. 5C. As shown in FIGS. 5B and 5C, the dummy metal film 114 can be located at a position directly below the opening of the dummy metal film 112. As the arrangement formed by the combination of the dummy metal films 112 and 114, it is preferable that a dummy metal film is located at a position directly below an opening of the other metal film. Further, it is preferable that the dummy metal film located directly below the opening of the metal film has an area that is equal to or larger than that of the opening in the plan layout in order to effectively block the incident light.

In the third embodiment as well, wall-shaped metal portions 113 as in the second embodiment may be provided. More specifically, wall-shaped metal portions may be provided between a light-shielding film 107 and the dummy metal film 112 or between the dummy metal film 112 and the dummy metal film 114. Also, wall-shaped metal portions may be provided between the light-shielding film 107 and the dummy metal film 112 and between the dummy metal film 112 and the dummy metal film 114. Moreover, when a larger number of metal wiring layers are arranged, three or more double-layered dummy metal films according to the third embodiment can also be provided.

<Example of Processes of Manufacturing Solid-State Image Sensor According to Third Embodiment>

The process of forming a dummy metal film 114 in the same layer as a first metal wiring layer 105 simultaneously with the formation of the first metal wiring layer 105 according to the third embodiment is the same as that of forming a dummy metal film 112 in the first embodiment. Hence, a detailed description of this process will not be given. Also, when wall-shaped metal portions 113 as in the second embodiment are provided, this process can be understood from the example of the manufacturing processes according to the second embodiment.

[Fourth Embodiment]
<Example of Configuration of Solid-State Image Sensor According to Fourth Embodiment>

Figure 6A:
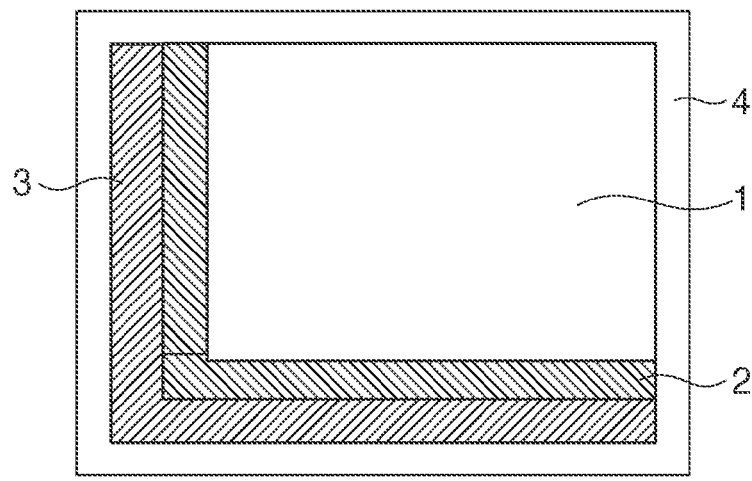
FIG. 6A is a plan view schematically showing the plan layout of a solid-state image sensor.
Figure 6B:
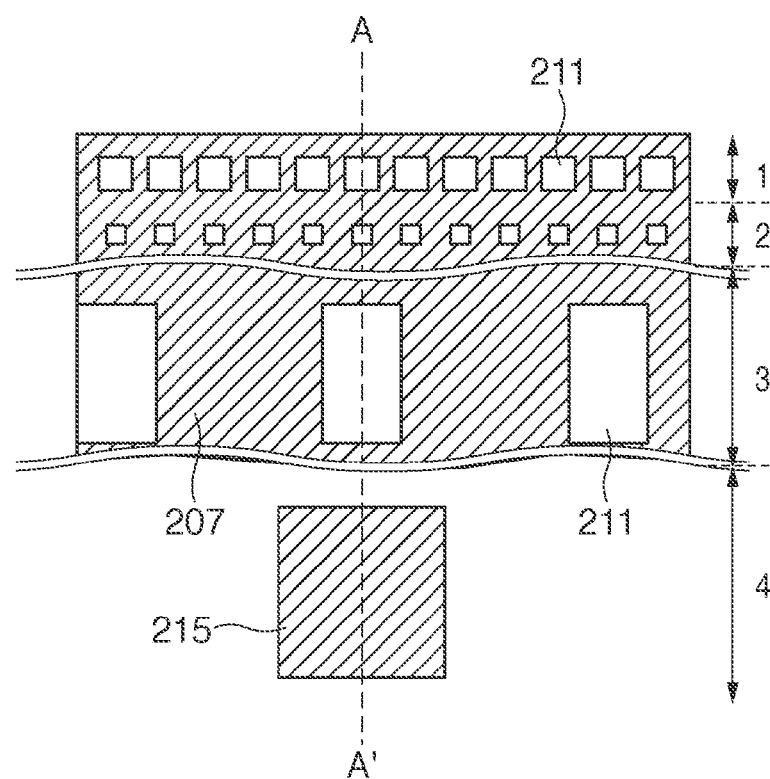
FIG. 6B is a plan view showing the plan layout of a solid-state image sensor according to the fourth and fifth embodiments.
Figure 7A:
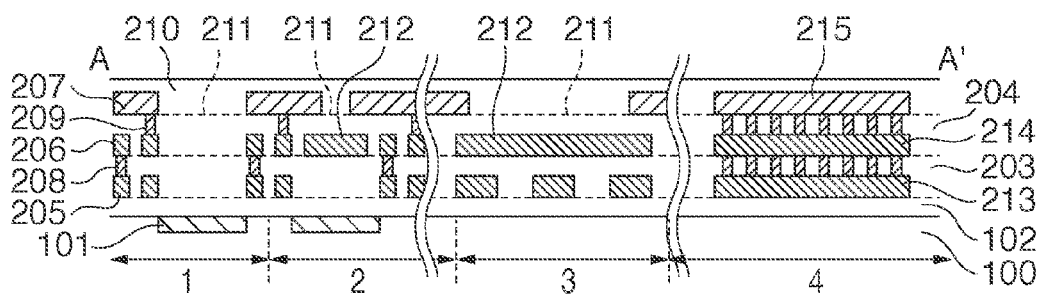
FIG. 7A is a sectional view showing an example of a cross-sectional structure taken along a broken line A-A' in FIG. 6B according to the fourth embodiment.

FIG. 6B is an enlarged plan view showing an example of the plan layout of a solid-state image sensor shown in FIG. 6A according the fourth embodiment. FIG. 7A is a sectional view showing a cross-sectional structure taken along a broken line A-A' in FIG. 6B according to the fourth embodiment. As shown in FIG. 6B, the solid-state image sensor has an effective pixel portion including an effective pixel region 1 in which a plurality of pixels are arrayed. The solid-state image sensor also has a peripheral portion which falls within the effective pixel portion peripheral region and includes an optical black region 2 used to obtain a reference signal, a peripheral circuit region 3, and an electrode pad region 4. Each of the effective pixel region 1 and optical black region 2 includes a two-dimensional array of a plurality of pixels. The peripheral circuit region 3 includes, for example, an operational amplifier circuit, horizontal scanning circuit, and vertical scanning circuit. The electrode pad region 4 governs external power supply and transfer of an electrical signal to an external signal processing circuit. As shown in FIG. 7A, photodiodes 101 are provided on a semiconductor substrate 100 in the effective pixel region 1 and optical black region 2. For the sake of simplicity, some of MOS transistors and metal plugs provided on the semiconductor substrate 100 are not shown. A first metal wiring layer 205, second metal wiring layer 206, and light-shielding film 207 are formed on insulating films 102, 203, and 204, respectively, above the semiconductor substrate 100. The light-shielding film 207 also serves as a metal wiring layer used as a reference potential and a power supply line. The light-shielding film 207 is the top layer among the metal wiring layers 205, 206, and 207. The first metal wiring layer 205 and second metal wiring layer 206 can be electrically connected to each other by metal plugs 208. The second metal wiring layer 206 and light-shielding film 207 can be electrically connected to each other by metal plugs 209. The insulating films 102, 203, and 204 are formed from, for example, silicon oxide films. The first metal wiring layer 205, second metal wiring layer 206, and light-shielding film 207 are formed from, for example, a metal or intermetallic compound containing aluminum as its major component. The metal plugs 208 and 209 are formed from, for example, a metal containing tungsten as its major component. The light-shielding film 207 is covered with a planarizing film 210, which is formed from an insulating film such as a silicon oxide film.

Conventionally, almost the entire surfaces of the optical black region 2 and peripheral circuit region 3 are covered with the light-shielding film 207. In contrast, in the fourth embodiment, openings 211 are provided even in the light-shielding film 207 which covers the optical black region 2 and peripheral circuit region 3, as shown in FIG. 6B. The openings 211 are provided in the light-shielding film 207 on all pixels in the optical black region 2, as shown in FIG. 7A. A dummy metal film 212 is provided in the same layer as the second metal wiring layer 206 below the light-shielding film 207, and plays a role in blocking light incident on the photodiodes 101 via the openings 211. Moreover, the openings 211 are provided above regions in which the dummy metal film 212 can be provided in the same layer as the second metal wiring layer 206 below the light-shielding film 207 in the peripheral circuit region 3, as shown in FIG. 7A. The dummy metal film 212 plays a role in blocking light incident on the photodiodes 101 via the openings 211. A circuit arranged in the peripheral circuit region 3 can include, for example, a scanning circuit. Moreover, the electrode pad region 4 is provided to be adjacent to the peripheral circuit region 3. The electrode pad region 4 includes a first electrode pad 213, second electrode pad 214, and top layer electrode pad 215. The first electrode pad 213 and second electrode pad 214 are electrically connected to each other by the metal plugs 208. The second electrode pad 214 and top layer electrode pad 215 are electrically connected to each other by the metal plugs 209. The first electrode pad 213 is, for example, formed in the same layer as the first metal wiring layer 205 using a metal containing aluminum as its major component. The second electrode pad 214 is, for example, formed in the same layer as the second metal wiring layer 206 using a metal containing aluminum as its major component. The top layer electrode pad 215 is, for example, formed in the same layer as the light-shielding film 207 using a metal containing aluminum as its major component. Namely, a patterned metal wiring layer arranged at the top among the plurality of metal layers includes a metal pattern which functions as the light-shielding film 207, and that which functions as the top layer electrode pad 215.

<Example of Processes of Manufacturing Solid-State Image Sensor According to Fourth Embodiment>

A manufacturing method according to the fourth embodiment will be described next with reference to FIGS. 7A to 7D. For the sake of simplicity, the process of forming a first metal wiring layer 205 and its subsequent processes will be described.

Figure 7B:
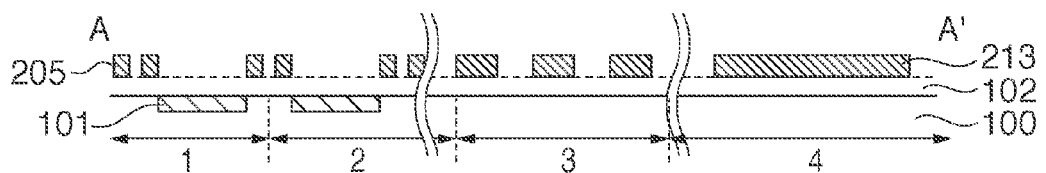
FIGS. 7B, 7C, and 7D are sectional views showing an example of the processes of manufacturing a solid-state image sensor according to the fourth embodiment.

FIG. 7B is a sectional view after a first metal wiring layer 205 is formed. The first metal wiring layer 205 is formed by depositing a metal containing aluminum as its major component using a sputtering method, performing photoresist coating, exposure, and development, and thereupon using a dry etching method. Moreover, a first electrode pad 213 can be formed simultaneously with the formation of the first metal wiring layer 205.

Figure 7C:
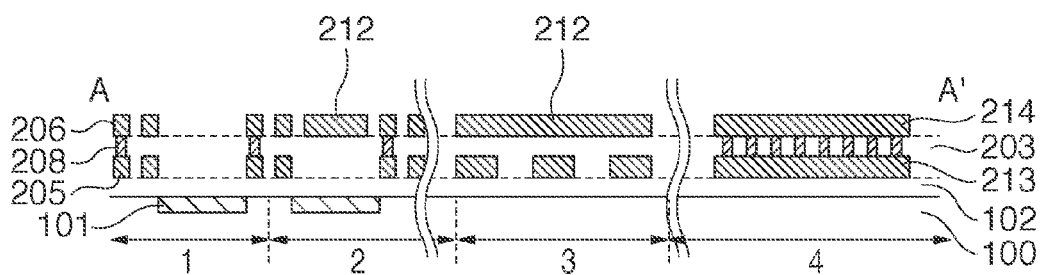

FIG. 7C is a sectional view after a second metal wiring layer 206 is formed. The second metal wiring layer 206 is formed on an insulating film 203 formed on the first metal wiring layer 205. The insulating film 203 is formed by depositing a silicon oxide film on the first metal wiring layer 205 using a plasma CVD method, and planarizing it using a CMP method. Upon photoresist coating, exposure, and development, openings are formed in the insulating film 203 using a dry etching method to form metal plugs 208. The metal plugs 208 can be formed by sequentially depositing titanium and titanium nitride using a sputtering method, depositing tungsten using a CVD method, and removing the titanium, titanium nitride, and tungsten in a region other than the openings using CMP. A second metal wiring layer 206 is formed in accordance with the same procedure as in the first metal wiring layer 205, and a dummy metal film 212 and second electrode pad 214 made of a metal containing aluminum as its major component are simultaneously formed.

Figure 7D:
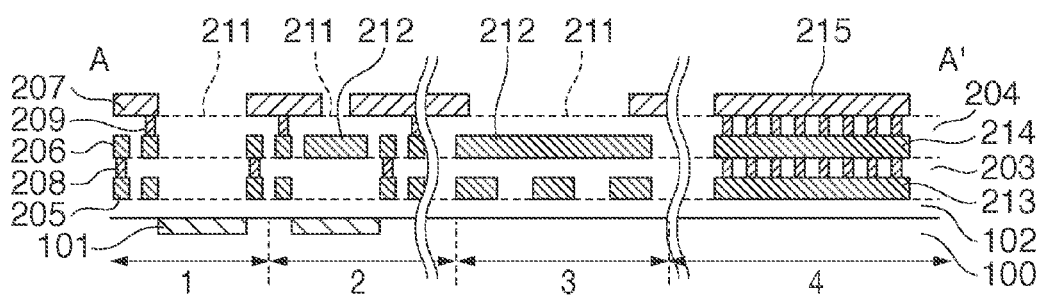

FIG. 7D is a sectional view after a light-shielding film 207 is formed. The light-shielding film 207 is formed on an insulating film 204 formed on the second metal wiring layer 206. The insulating film 204 is formed in accordance with the same procedure as in the insulating film 203. Metal plugs 209 are formed in accordance with the same procedure as in the metal plugs 208. A light-shielding film 207 is formed in the same procedure as in the first metal wiring layer 205, and a top layer electrode pad 215 made of a metal containing aluminum as its major component is simultaneously formed. Moreover, in the process of forming the light-shielding film 207, openings 211 are formed in an effective pixel region 1. At the same time, openings 211 are formed in an optical black region 2 and peripheral circuit region 3.

An insulating film such as a silicon oxide film is deposited using a plasma CVD method and planarized using a CMP method to form a planarizing film 210, and the process reaches the state shown in FIG. 7A.

[Fifth Embodiment]
<Example of Configuration of Solid-State Image Sensor According to Fifth Embodiment>

Figure 8A:
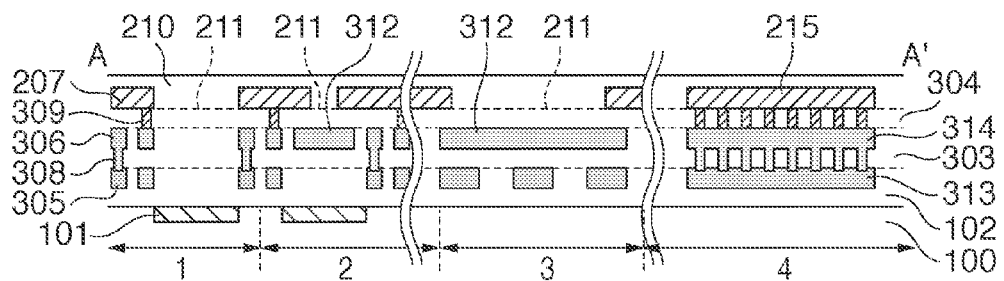
FIG. 8A is a sectional view showing an example of a cross-sectional structure taken along the broken line A-A' in FIG. 6B according to the fifth embodiment.

FIG. 8A is a sectional view showing a cross-sectional structure taken along the broken line A-A' in FIG. 6B. As shown in FIG. 8A, photodiodes 101 are provided on a semiconductor substrate 100 in an effective pixel region 1 and optical black region 2. For the sake of simplicity, some of MOS transistors and metal plugs provided on the semiconductor substrate 100 are not shown. A first metal wiring layer 305, second metal wiring layer 306, and light-shielding film 207 are formed on insulating films 102, 103, and 304, respectively, above the semiconductor substrate 100. The light-shielding film 207 also serves as a metal wiring layer used as a reference potential and a power supply line. The light-shielding film 207 is the top layer among the metal wiring layers 305, 306, and 207. The first metal wiring layer 305 and second metal wiring layer 306 can be electrically connected to each other by metal plugs 308. The second metal wiring layer 306 and light-shielding film 207 are electrically connected to each other by metal plugs 309. The insulating films 102, 303, and 304 are formed from, for example, silicon oxide films. The first metal wiring layer 305, second metal wiring layer 306, and metal plugs 308 are formed from, for example, a metal containing copper as its major component. The light-shielding film 207 is formed from, for example, a metal containing aluminum as its major component. The metal plugs 309 are formed from, for example, tungsten as its major component. The light-shielding film 207 is covered with a planarizing film 210, which is formed from an insulating film such as a silicon oxide film.

Conventionally, almost the entire surfaces of the optical black region 2 and a peripheral circuit region 3 are covered with the light-shielding film 207. In contrast, in the fifth embodiment, openings 211 are provided even in the light-shielding film 207, which covers the optical black region 2 and peripheral circuit region 3, as shown in FIG. 6B. The openings 211 are provided in the light-shielding film 207 on all pixels in the optical black region 2, as shown in FIG. 8A. A dummy metal film 312 is provided in the same layer as the second metal wiring layer 306 below the light-shielding film 207, and plays a role in blocking light incident on the photodiodes 101 via the openings 211. Moreover, the openings 211 are provided above regions in which the dummy metal film 312 can be provided in the same layer as the second metal wiring layer 306 below the light-shielding film 207 in the peripheral circuit region 3, as shown in FIG. 8A. The dummy metal film 312 plays a role in blocking light incident on the photodiodes 101 via the openings 211. A circuit arranged in the peripheral circuit region 3 can include, for example, a scanning circuit. Moreover, an electrode pad region 4 is provided to be adjacent to the peripheral circuit region 3. The electrode pad region 4 includes a first electrode pad 313, second electrode pad 314, and top layer electrode pad 215. The first electrode pad 313 and second electrode pad 314 are electrically connected to each other by the metal plugs 308. The second electrode pad 314 and top layer electrode pad 215 are electrically connected to each other by the metal plugs 309. The first electrode pad 313 is, for example, formed in the same layer as the first metal wiring layer 305 using a metal containing copper as its major component. The second electrode pad 314 is, for example, formed in the same layer as the second metal wiring layer 306 using a metal containing copper as its major component. The top layer electrode pad 215 is, for example, formed in the same layer as the light-shielding film 207 using a metal containing aluminum as its major component.

<Example of Processes of Manufacturing Solid-State Image Sensor According to Fifth Embodiment>

A manufacturing method according to the fifth embodiment will be described next with reference to FIGS. 8A to 8D. For the sake of simplicity, the process of forming a first metal wiring layer 305 and its subsequent processes will be described.

Figure 8B:
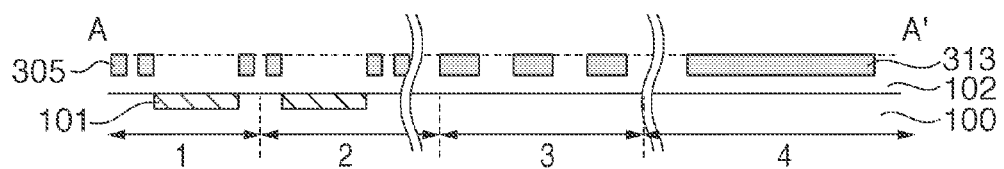
FIGS. 8B, 8C, and 8D are sectional views showing an example of the processes of manufacturing a solid-state image sensor according to the fifth embodiment.

FIG. 8B is a sectional view after a first metal wiring layer 305 is formed. The first metal wiring layer 305 is, for example, formed using a metal containing copper as its major component by a single damascene method. More specifically, upon photoresist coating, exposure, and development, a wiring groove is formed in an insulating film 102 using a dry etching method, tantalum nitride and copper are sequentially formed using a sputtering method, and copper is deposited using a plating method. Any unwanted tantalum nitride and copper are removed using a CMP method to form a first metal wiring layer 305. Moreover, a first electrode pad 313 is formed simultaneously with the formation of the first metal wiring layer 305.

Figure 8C:
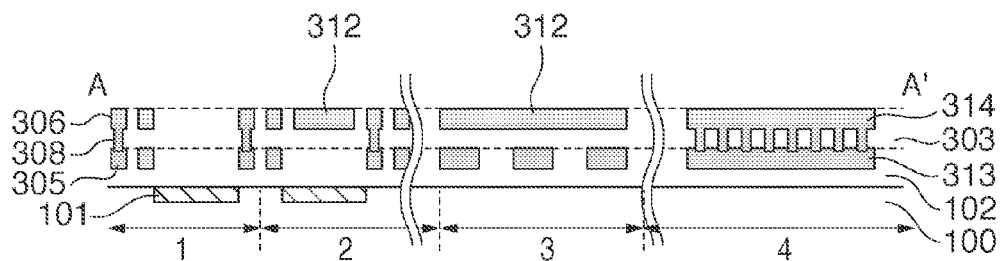

FIG. 8C is a sectional view after a second metal wiring layer 306 is formed. The second metal wiring layer 306 is, for example, formed on an insulating film 303 formed on the first metal wiring layer 305 using a metal containing copper as its major component by a dual damascene method. More specifically, the insulating film 303 is formed by depositing a silicon oxide film on the first metal wiring layer 305 using a plasma CVD method. Upon photoresist coating, exposure, and development, openings are formed in regions on the insulating film 303, in which a wiring layer and metal plugs are to be formed, using a dry etching method, tantalum nitride and copper are sequentially formed using a sputtering method, and copper is deposited using a plating method. Any unwanted tantalum nitride and copper are removed using a CMP method to form a second metal wiring layer 306 and metal plugs 308. Moreover, a dummy metal film 312 and second electrode pad 314 are formed simultaneously with the formation of the second metal wiring layer 306.

Figure 8D:
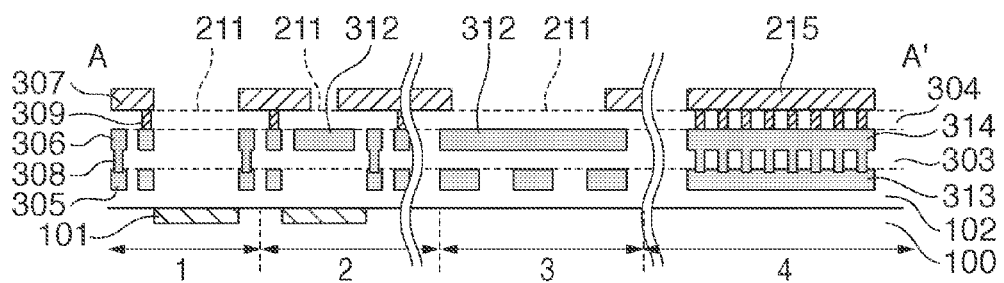

FIG. 8D is a sectional view after a light-shielding film 207 is formed. The light-shielding film 207 is formed on an insulating film 304 formed on the second metal wiring layer 306. The insulating film 304 is formed in accordance with the same procedure as in the insulating film 303. Metal plugs 309 are formed by sequentially depositing titanium and titanium nitride using a sputtering method, depositing tungsten using a CVD method, and removing the titanium, titanium nitride, and tungsten in a region other than the openings using CMP. A metal containing aluminum as its major component is deposited using a sputtering method, photoresist coating, exposure, and development are performed, and thereupon a light-shielding film 207 is formed using a dry etching method. A top layer electrode pad 215 made of a metal containing aluminum as its major component is simultaneously formed. Moreover, in the process of forming the light-shielding film 207, openings 211 are formed in an effective pixel region 1. At the same time, openings 211 are formed in an optical black region 2 and peripheral circuit region 3.

An insulating film such as a silicon oxide film is deposited using a plasma CVD method and planarized using a CMP method to form a planarizing film 210, and the process reaches the state shown in FIG. 8A.

[Effects of First to Fifth Embodiments]

According to the first to fifth embodiments, steps on the planarizing film 110 can be reduced at the boundary between the effective pixel region 1 and the effective pixel region peripheral portion including the optical black region 2 and peripheral circuit region 3. This makes it possible to uniformly form the planarizing film 110. This, in turn, makes it possible to suppress luminance and color variations due to nonuniformity of the optical path difference of incident light. It is also possible to uniformly form the planarizing film 110 without adding any new process. Note that the first to third embodiments can be combined as needed, as described above. All of the above-described embodiments merely show practical examples in carrying out the present invention, and the technical scope of the present invention should not be interpreted in a limited sense by these embodiments. That is, the present invention can be practiced in various forms without departing from its technical idea or its main features.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2010-061233 and 2011-031260, filed Mar. 17, 2010 and Feb. 16, 2011, respectively, which are, hereby incorporated by reference herein in their entirety.

What is claimed is:

1. A solid-state image sensor, the sensor comprising:
a first photodiode formed in a semiconductor substrate, and a second photodiode formed in said semiconductor substrate,
a plurality of metal wiring layers arranged above said first photodiode and said second photodiode, said plurality of metal wiring layers including a first metal wiring layer and a second metal wiring layer arranged above said first metal wiring layer; and
a planarizing film covering said second metal wiring layer,
wherein said first metal wiring layer has a first opening provided above said first photodiode, a second opening provided above said second photodiode, and a portion arranged in said second opening,
wherein said second metal wiring layer has a third opening arranged above said first opening, and a fourth opening arranged above said second opening, and
wherein, when viewed from a direction perpendicular to a surface of said substrate, said portion arranged in the second opening extends so as to occupy an entire re ion of said fourth opening.

2. The sensor according to claim 1, wherein a ratio of an area occupancy of said second metal wiring layer provided above said first photodiode to an area occupancy of said second metal wiring layer provided above said second photodiode is not less than 0.6.

3. The sensor according to claim 1, wherein said plurality of metal wiring layers include a third metal wiring layer provided above said second photodiode, said third metal wiring layer having an opening being positioned between said first metal wiring layer provided above said second photodiode and said second metal wiring layer provided above said second photodiode.

4. The sensor according to claim 1, further comprising a wall-shaped metal portion which is formed on said first metal wiring layer provided above said second photodiode, and is configured to block light incident in a direction in which the light intersects with the direction perpendicular to said surface of said semiconductor substrate.

5. The sensor according to claim 4, wherein said wall-shaped metal portion connects said second metal wiring layer provided above said second photodiode and said first metal wiring layer provided above said second photodiode to each other.

6. The sensor according to claim 1, further comprising a peripheral circuit region configured to process a signal from said first photodiode and said second photodiode.

7. The sensor according to claim 6, further comprising a peripheral circuit in a region different from a region where said first photodiode and said second photodiode are arranged,
wherein said second metal wiring layer has an opening provided above said peripheral circuit.

8. The sensor according to claim 1, wherein said second metal wiring layer includes a metal pattern which functions as an electrode pad.

9. The sensor according to claim 8, wherein said metal pattern contains aluminum as a major component thereof.

10. The sensor according to claim 1, wherein said planarizing film has a planarized surface.

11. The sensor according to claim 1, further comprising a wall-shaped metal portion which is formed between said second metal wiring layer provided above said second photodiode and said first metal wiring layer provided above said second photodiode so as to surround a region to which light passing through said second openings enters.

12. The sensor according to claim 11, wherein said wall-shaped metal portion is a plug electrically connecting said first metal wiring layer and said second metal wiring layer.

13. A solid-state image sensor, comprising:
a semiconductor substrate;
a photodiode formed in said semiconductor substrate;
a peripheral circuit including a transistor formed on said semiconductor substrate;
a plurality of metal wiring layers arranged above said photodiode and said transistor, said plurality of metal wiring layers including a first metal wiring layer and a second metal wiring layer arranged above said first metal wiring layer; and
a planarizing film covering said second metal wiring layer,
wherein said first metal wiring layer has a first opening provided above said photodiode, a second opening provided above said transistor, and a portion arranged in said second opening,
wherein said second metal wiring layer has a third opening arranged above said first opening, and a fourth opening arranged above said second opening, and
wherein, when viewed from a direction perpendicular to a surface of said substrate, said portion arranged in the second opening extends so as to occupy an entire region of said fourth opening.

14. The sensor according to claim 1, wherein when viewed from the direction perpendicular to the surface of said substrate, an area of said third opening is larger than an area of said fourth opening.

* * * * *